United States Patent [19]

Norgren et al.

[11] 4,419,592
[45] Dec. 6, 1983

[54] BIDIRECTION DATA SWITCH SEQUENCING CIRCUIT

[75] Inventors: Kent S. Norgren, Longmont; Stephen E. Stucka, Boulder, both of Colo.

[73] Assignee: International Business Machines Corporation, Armonk, N.Y.

[21] Appl. No.: 170,374

[22] Filed: Jul. 21, 1980

[51] Int. Cl.³ ........................ H03K 17/56; H03K 5/13
[52] U.S. Cl. .................................. 307/241; 307/242; 307/269; 307/456
[58] Field of Search ............... 307/241, 243, 456, 244; 178/19 FG

[56] References Cited

U.S. PATENT DOCUMENTS

| | | | |
|---|---|---|---|
| 3,769,525 | 10/1973 | Foss et al. | 307/456 |
| 3,792,292 | 2/1974 | Priel | 307/241 |
| 3,843,834 | 10/1974 | Banke | 178/60 |
| 3,893,086 | 7/1975 | Nanya | 340/173 R |
| 3,912,947 | 10/1975 | Buchanan | 307/269 |
| 4,011,465 | 3/1977 | Alvarez, Jr. | 307/208 |
| 4,154,978 | 5/1979 | Tu | 178/58 A |
| 4,158,147 | 6/1979 | Edwards | 307/241 |
| 4,315,167 | 2/1982 | Pelc | 307/242 |

Primary Examiner—Stanley D. Miller
Assistant Examiner—B. P. Davis
Attorney, Agent, or Firm—Carl M. Wright

[57] ABSTRACT

Circuit for sequencing asynchronously the direction-indicating signal and the gating signal to bidirectional switch so that the direction-indicating signal is maintained before, during, and after the gating signal. Provision is also made for producing two gating signals in response to a change in the direction of transmission through the bidirectional switch if the direction-indicating signal changes during the gating signal.

3 Claims, 4 Drawing Figures

BIDIRECTION DATA SWITCH SEQUENCING CIRCUIT

DESCRIPTION

TECHNICAL FIELD

This invention relates to signal sequencing circuits and particularly to the proper sequencing of controlling signals to bidirectional data switching circuits.

When bidirectional data switching circuits are used, two signals are required to control their operation. One signal is a direction indicating signal which determines the direction the data is to be passed through the bidirectional switch circuits. The second signal is an enabling or gating signal which causes the data to be switched.

It is usually essential that the directional signal be stabilized before the gating signal is applied and that the directional signal not change during the gating signal's application. Otherwise, the signals on the bus become uncertain and anomalous. The switching circuits are also thereby degraded, it has been discovered, leading to early failure.

BACKGROUND ART

Bipolar circuits usually have sufficient power to drive data buses directly. The output capability of bipolar transistors provide for large current pulses at the operating voltage.

Metallic oxide and silicon-on-sapphire circuits use small transistor configurations for the on-board logic functions but the output stages are usually required to be large so as to have sufficient drive capability for peripheral devices and buses. The large output stages are expensive and use considerably large areas of the substrate. They are usually high impedance devices so that their switching speed is limited by the external capacitance that they must drive. Complicated precharge circuits are used to increase the switching speed of these high impedance switches but such circuits require additional timing and logic which make the precharge approach to speed-up undesirable.

The output drive capability of integrated circuits such as microprocessors are usually a design compromise between the worst case condition and the available area for structuring the output stages. Sometimes in practice, the entire available drive capability is not always required so the extra drive capacity is wasted.

If a microprocessor is designed having the minimum possible output drive capability, the result is a less expensive and smaller microprocessor. It would, however, require external drive circuits, increasing the on-board components in most applications. This is not usually a disadvantage in large systems using many on-board devices anyway.

The external driver circuits to be used would preferably be tri-state. That is, when activated, the output circuit assumes one of two logic states to drive the connected devices. These states provide low impedance paths to ground or to the power supply. When inactive, however, the driver presents a high impedance which does not load down other activated drivers on the line. This high impedance state is the third state.

U.S. Pat. No. 3,912,947 shows a sequencing circuit for a tri-state output circuit. The purpose of the disclosed circuit in the patent is to provide the activated output signal for a time period that is longer than the gating circuit. The circuit is unidirectional, however, and does not provide the directional-enabling signal sequencing that is the subject matter of this application.

DISCLOSURE OF THE INVENTION

Two ports for sending and receiving signals are coupled by bidirectional gates which provide, in response to an enabling signal, a signal path in one of two selectable directions, the direction being dependent upon a steering signal value. A pair of source means supply a direction-indicating signal and a gating signal. An asynchronous circuit according to the invention receives the signals from the source means and produces a steering signal and an enabling signal so that the steering signal is established before the enabling signal is provided.

The advantage of this signal arrangement is that the direction-indicating signal to the bidirectional gate means, the steering signal, does not change while the gating signal is active, thereby preventing degradation of the switches in the bidirectional gating means and preventing damage to the output stages of the ports which would result from attempting to force a signal through the output stages in both directions at once. A field-effect transistor in the latter case may be destroyed.

DESCRIPTION OF THE PREFERRED EMBODIMENT

Figure 1:
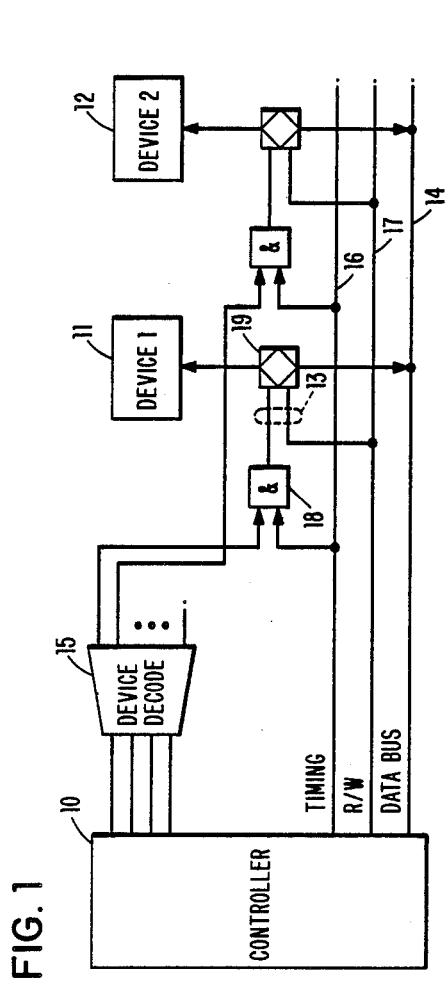
FIG. 1 is a block diagram of a system in which the invention is useful wherein each peripheral device is coupled to a data bus through an individual bidirectional switch.

In FIG. 1, a typical system in which the invention is useful includes a controller 10 and several connected peripheral devices represented by device 1 and device 2, 11 and 12, respectively. The controller 10, which is typically a programmed processor, supplies output signals for selecting the peripheral device to be read from or written to. In the illustrated system, the selected device is activated by a line from a decoder 15.

Emanating from the controller 10 are a data bus 14, a timing line 16, and a read/write (R/W) control line 17. The data bus 14, which is typically 8, 12, or 16 lines, is used to connect the data ports of the controller 10 to those of the peripheral devices 11 and 12 and to those of the memory, considered here to be part of the controller and not shown separately.

The timing line 16 is a single conductor used to supply a signal for providing data at the proper time during the execution of a data handling instruction, i.e., for taking data from the bus or for gating data onto the bus.

The R/W control line 17 is used to supply a signal indicating the direction of data movement, normally with respect to the controller's aspect. That is, the signal is high for a read, i.e., a transfer of data from the peripheral device to the controller and low for a write operation, i.e., the transfer of data from the controller to the peripheral device.

A particular device is selected by the decoder output 15 which is driven by signals generated within the controller in response to an instruction specifying the device to be used. The select line is combined with the timing signal using, typically, an AND gate 18 which supplies a gating signal to a bidirectional gating switch 19. The direction of the data movement by the switch 19 is determined by the value of the signal on the R/W line 17. A circuit according to the invention, to be described in more detail below, is inserted as a block 13 to insure that the directional signal is established before the gating or enabling signal is applied to the bidirectional switch 19.

Figure 2:
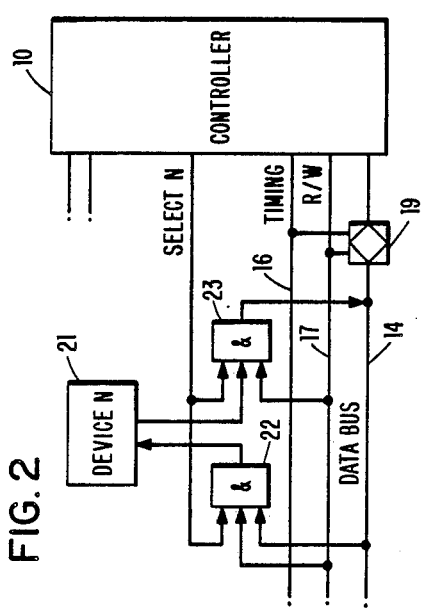
FIG. 2 is a block diagram of another system in which the invention is useful wherein a single bidirectional switch is used on the data bus.

The block diagram of FIG. 2 is an illustration of another system in which the invention will find utility. The controller 10 has the same output lines as described in connection with FIG. 1 except that a decoder is not used to select the device N 21. In this configuration, the bidirectional switch 19 is gated by the signal on the timing line 16 and the direction is determined, as before, by the signal on the R/W line 17. Only one bidirectional switch 19 is required in this configuration but bidirectional gates are required at each device. For example, when the controller 10 is reading data from device 21, a plurality of AND gates 23, the number being equal to the number of lines in the data bus 14, is enabled by the select signal and the R/W signal to pass the data from the device 21 onto the data bus 14. When writing to the device 21, a second plurality of AND gates 22 is enabled to pass the data from the data bus 14 to the device 21. In the configuration shown in FIG. 2, the circuit according to the invention is also placed at the control input lines to the bidirectional switch 19.

Figure 3:
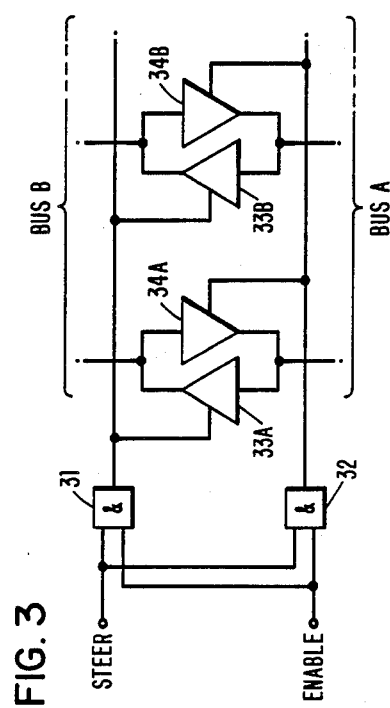
FIG. 3 is a logic diagram of a typical bidirectional switch.

FIG. 3 is a block diagram of a typical bidirectional switch. Such bidirectional switches are available commercially as the Type SN74LS245 Integrated Circuit (Texas Instruments, Inc.) which is described as Octal Bus Transceivers with 3-State Outputs. The 3-state output has already been described. Octal indicates that the circuit provides eight interbus switches.

In the circuit of FIG. 3, an enable signal is applied to one input of each of two AND gates 31 and 32. The steering signal is also applied to both gates but the AND gate 31 is activated if the steering signal is a logical one value (usually high) and the other AND gate 32 is activated if the steering signal is a logical zero value (usually low).

An active output signal from the AND gate 31 turns on a plurality of switches 33A, 33B, . . . , that couple the lines of a bus A to those of a bus B. The activated output signal from the AND gate 32 turns on a second set of switches 34A, 34B, . . . , which couple the lines of the bus B to the lines of the bus A. The data lines into the devices 11 and 12 of FIG. 1 are represented by the bus B in FIG. 3 and the data bus 14 of FIG. 1 is the bus A in FIG. 3.

Figure 4:
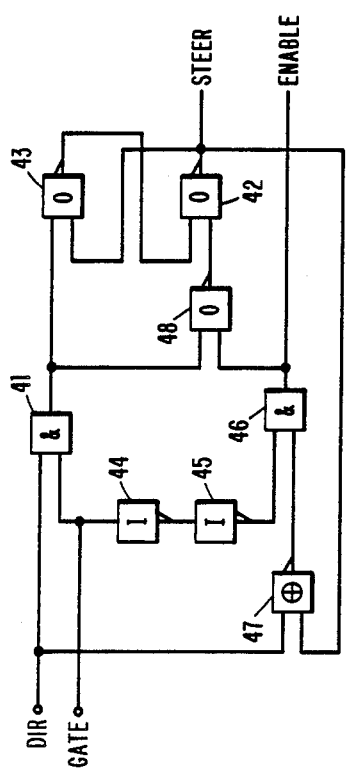
FIG. 4 is a logic diagram of a preferred embodiment of the invention.

A preferred embodiment of the invention is shown in FIG. 4. The input signals to the circuit are DIR, which in FIG. 1 is the R/W signal specifying the direction of the data path through the bidirectional switch, and GATE, which in FIG. 1 is the output signal from the AND gate 18 turning on the proper switches. The signals supplied to the bidirectional switch are STEER, which furnishes the directional information, and ENABLE, which is the gating signal for the bidirectional switch.

During the operation of the controller, the DIR and the GATE signals should be supplied in sequence, the DIR signal being established first and the GATE signal being generated subsequently and the DIR signal remaining in its established direction until the GATE signal is discontinued. This would insure that the signals do not attempt to change direction while passing through the switch. Sometimes, however, the above sequence (referred to below as the first case) is not always generated by the controller.

A second case is the simultaneous generation of the DIR and GATE signals. In this case, the circuit of the invention delays the ENABLE signal until the STEER signal is supplied to the bidirectional switch and continues the latter until the ENABLE signal is inactive.

A third case is the simultaneous activation of the STEER and GATE signals with the DIR signal changing during the period of the ENABLE (GATE) signal. In this case, the circuit delays the ENABLE signal until the STEER signal is established and when the DIR signal changes, inactivates the ENABLE signal until the STEER signal is established at its new value and then activates ENABLE again. In other words, the change of the DIR signal during the GATE signal is interpreted to mean that signals are to be gated successively through the bidirectional switch in opposite directions, a new rising edge being supplied when transferring the data in the second direction for logic circuit triggering.

Figure 5:
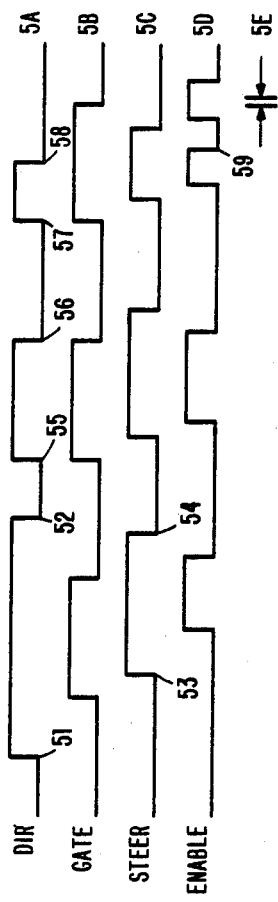
FIG. 5 is a timing diagram showing the relationship of the signals in the circuit of FIG. 4.

The timing diagram of FIG. 5 is an illustration of the signal relationships that occur for the three cases described above. For the first case, the DIR signal 5A extends from a first time reference 51 to a second time reference 52 which enclose the GATE signal 5B in the first case. The STEER signal 5C is generated between a time reference 53 and 54. The ENABLE signal 5D is supplied within this latter time period. The time delays between the leading edges of the input signals 5A and 5B and those of the output signals 5C and 5D result from the delays inherent in the circuit components. The time period shown in FIG. 5E is approximately a single gate delay.

For the second case, the DIR and GATE signals are generated simultaneously between the time references 55 and 56. The STEER signal is produced first, followed by the ENABLE signal whose time period is enclosed within that of the STEER signal. The extension of the output signals past the end of the input signals is another result of the component delays but does not adversely affect the system operation.

In the third case, the DIR and GATE input signal start simultaneously at the time reference 57 but the DIR signal 5A changes at the time reference 58 while the GATE signal 5B is still present. The circuit responds to this change by terminating the ENABLE signal 5D at the time reference 59 and producing another ENABLE pulse after the DIR signal 5A has been established in the opposite direction.

The circuit of FIG. 4 establishes the STEER output signal by passing the DIR signal through an AND gate 41 with the occurrence of the GATE signal to set a flip-flop comprising two cross-coupled NOR gates 42 and 43. If the output signal of the AND gate 41 is high, the STEER output signal will be set high by the output signal from the NOR gate 42.

The ENABLE signal is produced by the GATE signal, delayed by two inverters 44 and 45 in series, and the output signal from an EXCLUSIVE-NOR (XNOR)

gate 47, which produces a high output signal when the DIR and the STEER signals have the same value, combined in an AND gate 46. The XNOR gate 47 insures that the STEER signal is established at the correct value before the ENABLE signal is generated.

The flip-flop (NOR gates 42 and 43) insures that the STEER signal remains established until the ENABLE signal has been dropped.

A NOR gate 48 resets the flip-flop when the AND gate 41 and the AND gate 46 are disabled. This can occur by the removal of the GATE signal in which case the reset is delayed by the inverters 44 and 45 (in disabling the AND gate 46) or by a change in the DIR signal while the GATE signal is still active.

It is recognized that other circuits to perform the above-described sequencing and apparent variations thereof can be designed by persons of ordinary skill in the art. Variations of the sequences may be to ignore the change of the DIR signal while the GATE signal is active, in which case the circuit would lock in the STEER signal until the GATE signal and the resulting ENABLE signal were dropped. The case where the GATE signal occurs before the DIR signal would fall into this category, resulting in the data being gated in a direction opposite from that desired. The controller must, therefore, be assumed to produce the DIR signal not later than the GATE signal. Another variation would be to drop the ENABLE signal if the DIR signal change as just described, followed by dropping the STEER signal.

Various modifications to the systems and circuits described and illustrated to explain the concepts and modes of practicing the invention can be made by those of ordinary skill in the art within the principles or scope of the invention as expressed in the following claims.

What is claimed is:

1. In a circuit having at least two port means for sending and receiving signals, said port means being coupled to one another by bidirectional gating means for providing, in response to an enabling signal, a signal path in one of two selectable directions, the direction of said signal path depending on a steering signal, and first and second signal source means for respectively producing a gating signal and a direction indicating signal, the improvement comprising:
    asynchronous circuit means for producing said enabling signal and said steering signal in response to said first and second signal source means, said asynchronous circuit means including
    means for inhibiting said enabling signals until said steering signal is established.

2. The invention as claimed in claim 1 wherein said asynchronous circuit means further includes means for discontinuing said enabling signal if said direction indicating signal changes and for continuing said steering signal until said enabling signal is inactive.

3. The invention as claimed in claim 2 wherein said asynchronous circuit means further includes means for reactivating said enable signal when said steering signal has been established in the second direction.

* * * * *